(12) United States Patent
Zhang et al.

(10) Patent No.: US 11,119,596 B2
(45) Date of Patent: Sep. 14, 2021

(54) DISPLAY PANEL AND DRIVING METHOD, AND DISPLAY DEVICE

(71) Applicant: Wuhan Tianma Micro-Electronics Co., Ltd., Wuhan (CN)

(72) Inventors: Guofeng Zhang, Wuhan (CN); Junqiang Wang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 16/840,788

(22) Filed: Apr. 6, 2020

(65) Prior Publication Data

US 2021/0191546 A1 Jun. 24, 2021

(30) Foreign Application Priority Data

Dec. 23, 2019 (CN) .......................... 201911340906.7

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/322* (2013.01); *H01L 27/323* (2013.01); *H01L 27/3232* (2013.01); *H01L 27/3244* (2013.01); *H01L 51/5228* (2013.01); *H01L 51/5253* (2013.01); *G06F 2203/04107* (2013.01)

(58) Field of Classification Search
CPC ......... G06F 2203/04107; G06F 3/0412; H01L 27/322; H01L 27/323; H01L 27/3232; H01L 27/3244; H01L 51/5228; H01L 51/5253
USPC .................................................. 345/170–178
See application file for complete search history.

(56) References Cited

U.S. PATENT DOCUMENTS

| | | | |
|---|---|---|---|
| 2017/0287992 A1* | 10/2017 | Kwak | H01L 27/3234 |
| 2019/0214440 A1 | 7/2019 | Lee et al. | |
| 2019/0271911 A1* | 9/2019 | Wu | G03F 7/30 |
| 2019/0271912 A1* | 9/2019 | Li | H05K 3/027 |
| 2019/0293975 A1* | 9/2019 | Cheng | G02F 1/1336 |
| 2019/0293976 A1* | 9/2019 | Cheng | G06F 1/1626 |
| 2020/0012364 A1* | 1/2020 | Ye | H04M 1/0266 |
| 2020/0097113 A1* | 3/2020 | Fang | G06F 3/04164 |

(Continued)

FOREIGN PATENT DOCUMENTS

CN 107732024 A 2/2018

*Primary Examiner* — Tony O Davis
(74) *Attorney, Agent, or Firm* — Anova Law Group, PLLC (57) ABSTRACT

A display panel and driving method, and a display device are provided. The display panel includes a base substrate, and a light adjustment layer and a touch-control layer disposed over the base substrate. The touch-control layer includes a dummy touch-control structure, and the light adjustment layer includes a first structure. At least a portion of the dummy touch-control structure and the first structure have an overlapped region in a direction perpendicular to the base substrate. The dummy touch-control structure includes a first dummy touch-control structure in the overlapped region, and the first dummy touch-control structure is in contact with the first structure. The first structure in a first state has a first light transmittance, the first structure in a second state has a second light transmittance, and the first light transmittance is greater than the second light transmittance.

18 Claims, 7 Drawing Sheets

(56) References Cited

U.S. PATENT DOCUMENTS

| | | | |
|---|---|---|---|
| 2020/0117313 A1* | 4/2020 | Zhang | G06F 3/04164 |
| 2020/0301557 A1* | 9/2020 | Hsiao | G06F 3/04164 |
| 2020/0319751 A1* | 10/2020 | Yu | G06F 3/0443 |
| 2020/0326793 A1* | 10/2020 | Cheng | G02F 1/133512 |
| 2021/0005676 A1* | 1/2021 | Park | H01L 27/3276 |

* cited by examiner

DISPLAY PANEL AND DRIVING METHOD, AND DISPLAY DEVICE

CROSS-REFERENCES TO RELATED APPLICATIONS

This application claims the priority of Chinese patent application No. 201911340906.7, filed on Dec. 23, 2019, the entirety of which is incorporated herein by reference.

FIELD

The present disclosure generally relates to the field of display technology and, more particularly, relates to a display panel and driving method, and a display device.

BACKGROUND

An electroluminescent display is a self-illuminating display, and achieves real-time display function without using a backlight component. Compared with a liquid crystal display, because the electroluminescent display does not require the backlight component, the electroluminescent display can be made substantially light and thin, and can be applied in various scenarios.

A display panel among the electroluminescent display often has a display region and a border region. The border region surrounds the display region, and an optical device, e.g., a camera, can be disposed in the border region. Because the camera has a substantially large volume, the area of the occupied border region is substantially large, which causes significant limitations to achieving high screen ratio and narrow-border design.

Therefore, how to improve the high screen ratio of the display panel and achieve the narrow-border design is an urgent issue to be solved. The disclosed display panel and driving method, and display device are directed to solve one or more problems set forth above and other problems.

SUMMARY

One aspect of the present disclosure provides a display panel. The display panel includes a display region, including a photosensitive device region and a regular display region. The regular display region at least partially surrounds the photosensitive device region. The display region includes a plurality of sub-pixels, and the photosensitive device region includes a plurality of light-transmitting regions. The display panel also includes a base substrate, and a light adjustment layer and a touch-control layer disposed over the base substrate. The touch-control layer includes a dummy touch-control structure, and the light adjustment layer includes a first structure disposed at least in a light-transmitting region of the plurality of light-transmitting regions. At least a portion of the dummy touch-control structure and the first structure have an overlapped region in a direction perpendicular to the base substrate. The dummy touch-control structure includes a first dummy touch-control structure in the overlapped region, and the first dummy touch-control structure is in contact with the first structure. The first structure in a first state has a first light transmittance, the first structure in a second state has a second light transmittance, and the first light transmittance is greater than the second light transmittance.

Another aspect of the present disclosure provides a driving method of a display panel. The display panel includes a base substrate, and a light adjustment layer including a first structure. The display panel also includes a touch-control layer including a dummy touch-control structure. The dummy touch-control structure includes a first dummy touch-control structure in an overlapped region between the dummy touch-control structure and the first structure in a direction perpendicular to the base substrate. Further, the display panel includes an auxiliary electrode structure. The auxiliary electrode structure and the first dummy touch-control structure are disposed on opposite sides of the first structure in the direction perpendicular to the base substrate, respectively. The auxiliary electrode structure and the first dummy touch-control structure are in contact with the first structure, respectively. The driving method includes applying electrical signals to the first dummy touch-control structure and the auxiliary electrode structure to enable the first structure to be in a first state, and stopping applying an electrical signal to at least one of the first dummy touch-control structure and the auxiliary electrode structure to enable the first structure to be in a second state. The first structure in the first state has a first light transmittance, the first structure in the second state has a second light transmittance, and the first light transmittance is greater than the second light transmittance.

Another aspect of the present disclosure provides a display device. The display device includes a display panel. The display panel includes a display region, including a photosensitive device region and a regular display region. The regular display region at least partially surrounds the photosensitive device region. The display region includes a plurality of sub-pixels, and the photosensitive device region includes a plurality of light-transmitting regions. The display panel also includes a base substrate, and a light adjustment layer and a touch-control layer disposed over the base substrate. The touch-control layer includes a dummy touch-control structure, and the light adjustment layer includes a first structure disposed at least in a light-transmitting region of the plurality of light-transmitting regions. At least a portion of the dummy touch-control structure and the first structure have an overlapped region in a direction perpendicular to the base substrate. The dummy touch-control structure includes a first dummy touch-control structure in the overlapped region, and the first dummy touch-control structure is in contact with the first structure. The first structure in a first state has a first light transmittance, the first structure in a second state has a second light transmittance, and the first light transmittance is greater than the second light transmittance. A photosensitive device is correspondingly disposed in the photosensitive device region of the display panel.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

Figure 1:
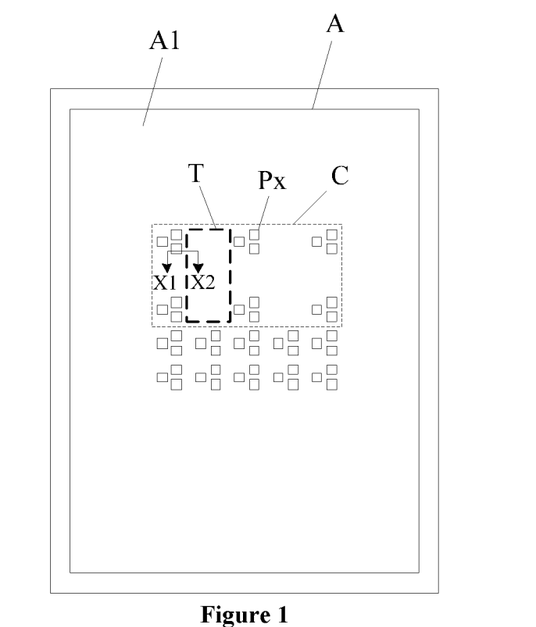
FIG. 1 illustrates a schematic diagram of an exemplary display panel consistent with disclosed embodiments of the present disclosure.
Figure 2:
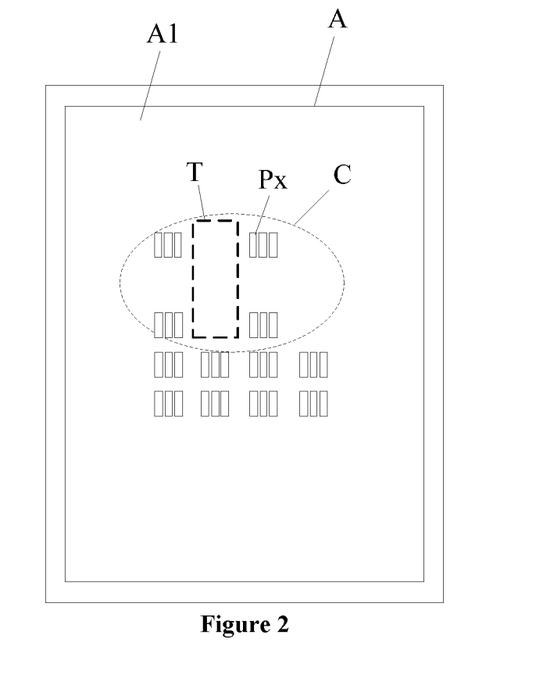
FIG. 2 illustrates a schematic diagram of another exemplary display panel consistent with disclosed embodiments of the present disclosure.
Figure 3:
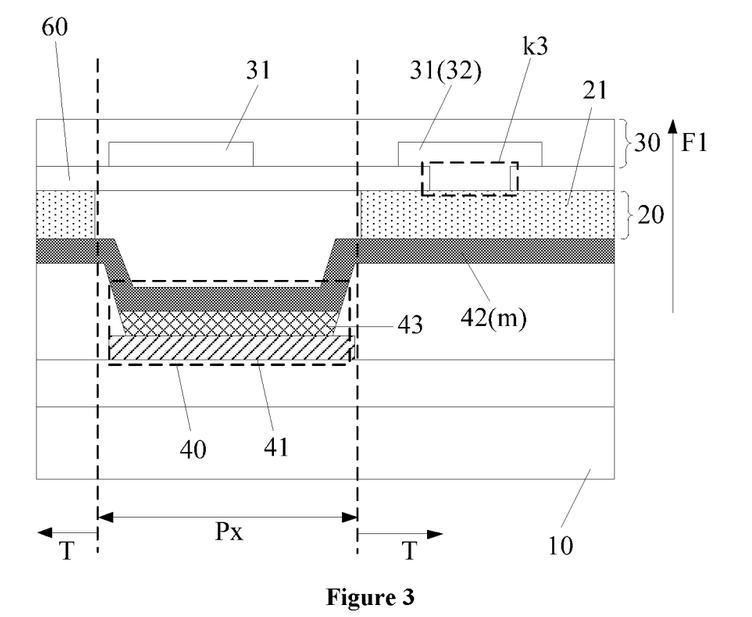
FIG. 3 illustrates a cross-sectional view of an exemplary structure of the display panel along X1-X2 direction in FIG. 1 consistent with disclosed embodiments of the present disclosure.
Figure 4:
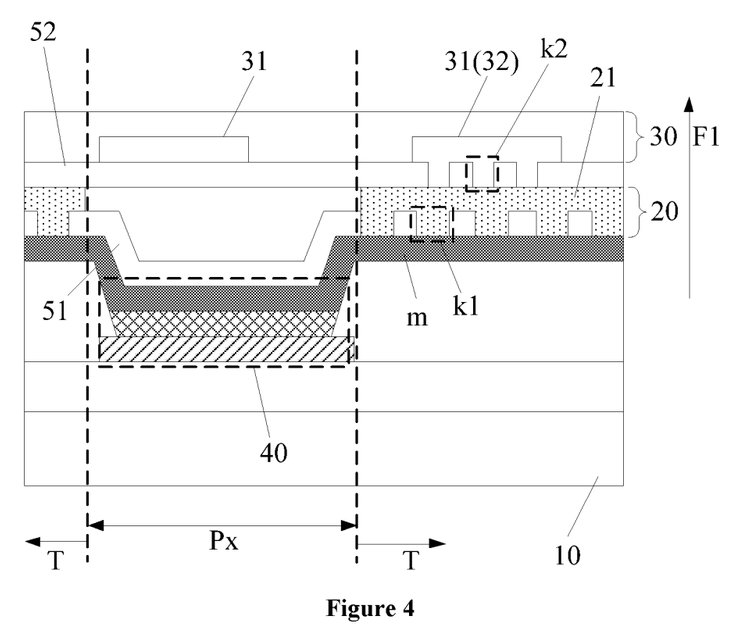
FIG. 4 illustrates a cross-sectional view of another exemplary structure of the display panel along X1-X2 direction in FIG. 1 consistent with disclosed embodiments of the present disclosure.

The present disclosure provides a display panel. FIG. 1 illustrates a schematic diagram of a display panel and FIG. 2 illustrates a schematic diagram of another display panel. FIG. 3 illustrates a cross-sectional view of an exemplary structure of the display panel along X1-X2 direction in FIG. 1; and FIG. 4 illustrates a cross-sectional view of another exemplary structure of the display panel along the X1-X2 direction in FIG. 1.

Referring to FIG. 1 and FIG. 2, the display panel may include a display region A. The display region A may include a photosensitive device region C and a regular display region A1. The regular display region A1 may at least partially surround the photosensitive device region C. The display region A may include a plurality of sub-pixels Px. The photosensitive device region C may include a plurality of light-transmitting regions T. In other words, a light-transmitting region T may be disposed between adjacent sub-pixels Px in the photosensitive device region C.

The photosensitive device region C may have a quadrangle shape (as illustrated in FIG. 1), an ellipse shape (as illustrated in FIG. 2), or any other shape (not illustrated), which may be determined according to practical applications and a shape of the photosensitive device, and may not be limited herein.

In addition, a disposal density of the sub-pixels Px in the photosensitive device region C may be a first density, and a disposal density of the sub-pixels Px in the regular display region A1 may be a second density. The first density may be smaller than the second density.

In view of this, the photosensitive device region C may not only achieve the display function, but also provide a substantially large amount of light for the photosensitive device, thereby improving the operating performance of the photosensitive device and the reliability of the display device.

Referring to FIG. 3 and FIG. 4, the display panel may further include a base substrate 10, and a light adjustment layer 20 and a touch-control layer 30 disposed over the base substrate 10. The touch-control layer 30 may include a dummy touch-control structure 31, and the light adjustment layer 20 may include a first structure 21 disposed at least in the light-transmitting region T. At least a portion of the dummy touch-control structure 31 and the first structure 21 may have an overlapped region in a direction perpendicular to the base substrate 10 (direction F1 illustrated in FIG. 3 and FIG. 4). The dummy touch-control structure 31 may include a first dummy touch-control structure 32 in the overlapped region, and the first dummy touch-control structure 32 may be in contact with the first structure 21.

The first structure 21 in a first state may have a first light transmittance, and the first structure 21 in a second state may have a second light transmittance. The first light transmittance may be greater than the second light transmittance.

In the disclosed embodiments of the present disclosure, the display region A may include the photosensitive device region C. When a photosensitive device is disposed in the photosensitive device region C, the issue that the photosensitive device occupies a large area when being disposed in the border may be prevented, such that the border may be set substantially narrow to increase the screen ratio and to achieve the narrow-border design.

The first state may correspond to an operating state of the photosensitive device, and the second state may correspond to a non-operating state of the photosensitive device. In addition, a display state of the display panel may correspond to the first state of the first structure 21. In view of this, in the first state, not only the display panel may desire to perform display, but also the photosensitive device may desire to receive light from outside to operate. The display state of the display panel may correspond to the second state of the first structure 21. In view of this, in the second state, the display panel may desire to perform display, while the photosensitive device may be in a non-operating state.

In other words, the display state of the display panel, the operating state of the photosensitive device, and the correspondence relationship between the first state and the second state of the first structure 21 may be designed according to practical applications, which may not be limited herein.

The first structure 21 may be disposed in a corresponding light-transmitting region T in the photosensitive device region C. The first structure 21 in the first state may have the first light transmittance, and the first structure 21 in the second state may have the second light transmittance. The first light transmittance may be greater than the second light transmittance. Therefore, when the photosensitive device is in the operating state, the first structure 21 may have the first light transmittance, such that a substantially large amount of light may be incident into the photosensitive device through the first structure 21, thereby improving the performance of photosensitive device.

In addition, when the photosensitive device is in the non-operating state and the display panel is in the display state, if the first structure 21 has the second light transmittance, the amount of light transmitted through the light-transmitting region T may be reduced by the first structure 21, thereby reducing the amount of light reflected by wiring disposed in the light-transmitting region T, and improving display contrast and display effect.

As disclosed herein, the dummy touch-control structure may be an electrode structure, to which no touch-control signal is needed to apply, during a touch-control detection process. The dummy touch-control structure is also referred to as "virtual touch-control structure" or "reference touch-control structure." In other words, the touch-control layer may include a first regular touch-control structure and a second regular touch-control structure. During the touch-control detection process, the dummy touch-control structure may not participate in the touch-control detection, while the structures participated in the touch-control detection may include the first regular touch-control structure and the second regular touch-control structure.

The reasons for disposing the dummy touch-control structure may include following. (1) The graphics of the first regular touch-control structure and the second regular touch-control structure may be weaken, such that the naked eye may not distinguish the graphics of the first regular touch-control structure and the second regular touch-control structure, which may facilitate improving the display effect of the display panel. (2) If there is no dummy touch-control structure, and there are the first regular touch-control structure and the second regular touch-control structure, a first portion of sub-pixels may overlap with the first regular touch-control structure or the second regular touch-control structure in the direction perpendicular to the base substrate, while a second portion of sub-pixels may not overlap with the first regular touch-control structure or the second regular touch-control structure in the direction perpendicular to the base substrate.

The light emitted from the non-overlapped second portion of sub-pixels may not be affected by the first regular touch-control structure or the second regular touch-control structure, such that the luminous brightness of the second portion of sub-pixels may not be affected by the first regular touch-control structure or the second regular touch-control structure. The light emitted from the overlapped first portion of sub-pixels may be affected by the first regular touch-control structure or the second regular touch-control structure, such that the luminous brightness of the first portion of sub-pixels may be affected by the first regular touch-control structure or the second regular touch-control structure. In view of this, the luminous brightness of the region where each sub-pixel is located may be non-uniform, which may affect the display effect.

The dummy touch-control structure may facilitate equalizing the luminous brightness of the region where each sub-pixel is located, reducing the difference in luminous brightness of the region where each sub-pixel is located, and improving the display effect.

In one embodiment, the first structure may be made of a material including but not limited to an electrochromic material. In other words, when a certain voltage is applied to the first structure, the state of the first structure may be adjusted, and then the light transmittance of the first structure may be adjusted.

Further, the electrochromic material may have a certain conductivity for ions and electrons. When each structure of the touch-control layer is in direct contact with a same first structure, certain structures in the touch-control layer may be short-circuited through the first structure, which may cause each structure in the touch-control layer not to operate properly.

Therefore, to avoid the above-mentioned issues, in one embodiment, an insulating layer (e.g., a film layer 60 illustrated in FIG. 3) may be disposed between the touch-control layer 30 and the light adjustment layer 20, to prevent the certain structures in the touch-control layer 30 from being short-circuited by the first structure 21, and to ensure each structure in the touch-control layer 30 to operate normally and effectively.

Further, to be capable of applying a certain voltage signal to the first structure 21 through the first dummy touch-control structure 32 to adjust the state of the first structure 21, a via (k3 illustrated in FIG. 3) may be disposed in the insulating layer 60 disposed between the touch-control layer 30 and the light adjustment layer 20, to enable the first structure 21 to be in direct contact with the first dummy touch-control structure 32.

In one embodiment, the display panel may further include an auxiliary electrode structure m. The auxiliary electrode structure m and the first dummy touch-control structure 32 may be disposed on opposite sides of the first structure 21 in the direction perpendicular to the base substrate 10 (e.g., the F1 direction illustrated in FIG. 3 and FIG. 4), respectively. The auxiliary electrode structure m may be in contact with the first structure 21.

When applying electrical signals to the first dummy touch-control structure 32 and the auxiliary electrode structure m, the first structure 21 may be in the first state. When not applying an electrical signal to at least one of the first dummy touch-control structure 32 and the auxiliary electrode structure m, the first structure 21 may be in the second state.

Further, the first structure 21 may be in the first state when applying an electrical signal to the first structure 21. In such state, the first structure 21 may have a substantially high light transmittance. In an operating stage of the photosensitive device, a substantially large amount of light may be provided for the photosensitive device, to improve the performance of the photosensitive device.

The first structure 21 may be in the second state when stopping applying an electrical signal to the first structure 21. In such state, the first structure 21 may have a substantially low light transmittance. In other words, in such state, the first structure 21 may present its own color. In view of this, the light transmittance may be reduced, and the amount of light incident on the cathode or the wiring surface may be reduced, to reduce the amount of light reflected by the cathode or the wiring surface, i.e., to weaken the reflected light. Because in the display stage, the reflected light interferes with the light emitted from the surrounding sub-pixels, weakening the reflected light may avoid such issue, may improve display contrast and display effects, thereby improving the viewing experience of the user.

In view of this, electrical signals may be applied to the first structure 21 through the first dummy touch-control structure 32 and the auxiliary electrode structure m, respectively, to adjust the state of the first structure 21, and then to adjust the light transmittance of the first structure 21, which may facilitate improving the display effect and the reliability of the display device.

In one embodiment, the auxiliary electrode structure m may be configured according to the following exemplary embodiments.

Exemplary Embodiment 1

In one embodiment, the light adjustment layer may be disposed between the base substrate and the touch-control layer. The display panel may further include a light-emitting layer disposed between the base substrate and the light adjustment layer. The light-emitting layer may include a first electrode, a second electrode, and an organic light-emitting layer disposed between the first electrode and the second electrode. The second electrode may be disposed on a side of the first electrode facing away from the base substrate. The second electrode may be multiplexed as the auxiliary electrode structure.

In one embodiment, referring to FIG. 3, the light-emitting layer 40 may be disposed between the base substrate 10 and the light adjustment layer 20. The first electrode 41 of the light-emitting layer 40 may be understood as an anode, and the second electrode 42 thereof may be understood as a cathode. Positive and negative charges may be inputted into the organic light-emitting layer 43 through the anode and cathode, respectively. The positive and negative charges may be recombined in the organic light-emitting layer 43 to generate energy, and the energy may excite a light-emitting material in the organic light-emitting layer 43 to emit light, thereby achieving the display function.

In view of this, the second electrode 42 (i.e., the cathode) may be multiplexed as the auxiliary electrode structure m. In other words, electrical signals may be applied to the first structure 21 through the cathode and the first dummy touch-control structure 32, respectively, to adjust the light transmittance of first structure 21, which may facilitate improving the display effect and the reliability of the display device. In one embodiment, the second electrode may be disposed fully covering the photosensitive device region.

Because the second electrode can be understood as a cathode, the sub-pixel may include a pixel circuit and a light-emitting layer (the light-emitting layer may be understood as a light-emitting unit) that are electrically connected. When the pixel circuit is electrically connected to the first electrode, the second electrode in the light-emitting layer of different sub-pixel may provide a same electrical signal, and the first electrode may provide a different electrical signal through a corresponding pixel circuit of different sub-pixel, to achieve the display demands of different sub-pixels. Therefore, the second electrode may be disposed fully covering the photosensitive device region. In other words, the second electrode may be a bulk electrode, and the second electrodes in different sub-pixels may be in direct contact with and electrically connected to each other, to reduce the production difficulty of the second electrode, thereby reducing the production difficulty of the display panel.

Further, a sub-pixel may be disposed in the regular display region, and the second electrode in each sub-pixel in the regular display region may provide a same electrical signal. Alternatively, the second electrode in the regular display region as well as the second electrode in the photosensitive device region may provide a same electrical signal, and, thus, the second electrode may be disposed fully covering the display region (including the photosensitive device region and the regular display region), which may facilitate the production of the second electrode, and at the same time, may reduce the production difficulty of the second electrode, thereby reducing the production difficulty of the display panel, and improving the production efficiency.

The light adjustment layer may be disposed in various suitable methods. In an exemplary method for disposing the light adjustment layer, the light adjustment layer may be in surface contact with the auxiliary electrode structure. In other words, when the second electrode 42 is multiplexed as the auxiliary electrode structure m, the insulating layer may not desire to be disposed between the light adjustment layer 20 and the auxiliary electrode structure m. Referring to FIG. 3, the light adjustment layer 20 may be in direct contact with the auxiliary electrode structure m in a surface contact manner, which may facilitate simplifying the production process of the display panel, reducing the production difficulty of the display panel, and improving the production efficiency, and at the same time, may facilitate reducing a thickness of the display panel, and achieving a light and thin design.

In another exemplary method for disposing the light adjustment layer, the light adjustment layer may be disposed between the base substrate and the touch-control layer. The display panel may further include a light-emitting layer, a first inorganic layer, and a second inorganic layer. The light-emitting layer may be disposed between the base substrate and the light adjustment layer. The first inorganic layer may be disposed between the light-emitting layer and the light adjustment layer, and the second inorganic layer may be disposed between the light adjustment layer and the touch-control layer. The first inorganic layer may cover the light-emitting layer.

In one embodiment, referring to FIG. 4, a plurality of film layers may be disposed between the light-emitting layer 40 and the touch-control layer 30, and may include the first inorganic layer 51, the light adjustment layer 20, and the second inorganic layer 52 sequentially disposed along the F1 direction as illustrated in FIG. 4.

Further, a structure composed of the first inorganic layer 51, the light adjustment layer 20, and the second inorganic layer 52 may be regarded as a thin film encapsulation layer. In other words, the light adjustment layer 20 may be integrated into the thin film encapsulation layer, and may not desire to be disposed outside the thin film encapsulation layer.

In one embodiment, the first inorganic layer 51 and the second inorganic layer 52 may be made of any material capable of achieving the functions of the first inorganic layer 51 and the second inorganic layer 52, e.g., a silicon oxide layer or a silicon nitride layer, which is not limited herein.

In view of this, not only the structural integration degree of the display panel may be improved, but also the quantity of film layers of the display panel may be reduced, which may reduce a thickness of the display panel, and may facilitate achieving the thin and light design.

In one embodiment, the light adjustment layer may be an organic layer. In other words, the organic layer may be disposed between the first inorganic layer and the second inorganic layer.

In view of this, the first inorganic layer and the second inorganic layer may effectively block the erosion of water and oxygen. The light adjustment layer may not only relieve the stress in the first inorganic layer and the second inorganic layer, when a crack occurs in the thin film encapsulation layer, but also block the extension of the crack. Thus, the flexibility and anti-cracking performance of the thin film encapsulation layer may be improved, and at the same time, the light transmittance may be adjusted, thereby improving the display effect and the reliability of the display device.

In one embodiment, the auxiliary electrode structure may be disposed on a side of the first inorganic layer away from the light adjustment layer. The first inorganic layer may include a plurality of first openings, and the auxiliary electrode structure may be in contact with the first structure at the first openings. The second inorganic layer may include a plurality of second openings, and the first dummy touch-control structure may be in contact with the first structure at the second openings.

In one embodiment, referring to FIG. 4, the auxiliary electrode structure m may be in direct contact with the first structure 21 through a first opening k1, and at the same time, the first structure 21 may be in direct contact with the first dummy touch-control structure 32 through a second opening k2.

In one embodiment, one first opening k1 and one second opening k2 may be disposed in one light-transmitting region T. The quantity and size of the first openings and the second openings may be determined according to practical applications, which are not limited herein.

In view of this, the auxiliary electrode structure and the first dummy touch-control structure may apply electrical signals to the first structure, respectively, to adjust the state of the first structure, and then to adjust the light transmittance of the first structure, thereby improving the display effect and reliability of the display device.

Exemplary Embodiment 2

In one embodiment, the light adjustment layer may be disposed on a side of the touch-control layer away from the base substrate, and the auxiliary electrode structure may be disposed on a side of the light adjustment layer away from the base substrate.

The display panel may further include a light-emitting layer and a cathode signal wire disposed between the base substrate and the touch-control layer. The light-emitting layer may include a cathode, and the auxiliary electrode structure and the cathode may be electrically connected to the cathode signal wire.

Figure 5:
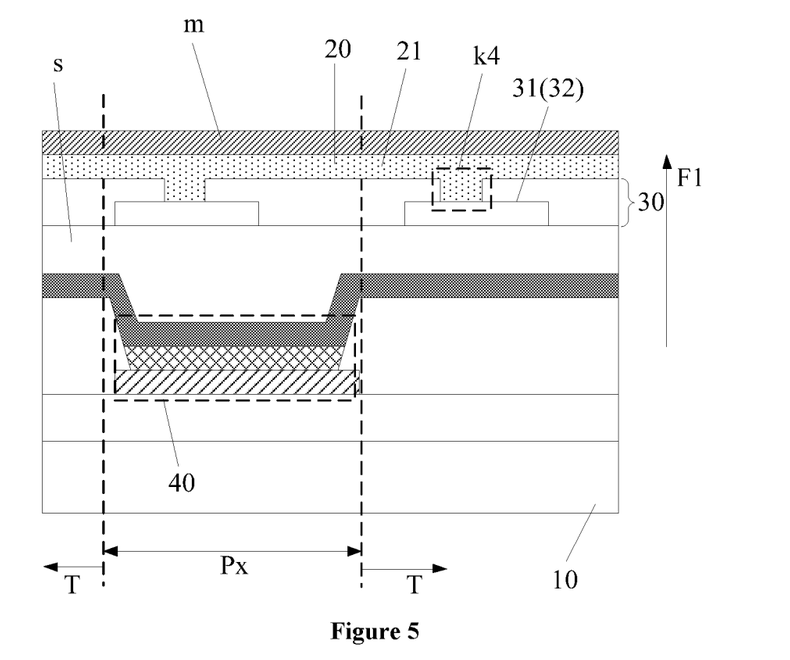
FIG. 5 illustrates a cross-sectional view of another exemplary structure of the display panel along X1-X2 direction in FIG. 1 consistent with disclosed embodiments of the present disclosure.

FIG. 5 illustrates a cross-sectional view of another exemplary structure of the display panel along X1-X2 direction in FIG. 1. In one embodiment, referring to FIG. 5, the light-emitting layer 40, the thin film encapsulation layer s, the touch-control layer 30, the light adjustment layer 20, and the auxiliary electrode structure m may be sequentially disposed over the base substrate 10 along the F1 direction illustrated in FIG. 5, respectively.

To apply an electrical signal to the first structure 21 through the auxiliary electrode structure m, the auxiliary electrode structure m may be electrically connected to the cathode signal wire, such that the auxiliary electrode structure m may provide a cathode signal to the first structure 21.

In combination with an electrical signal provided by the first dummy touch-control structure 32 and different from the cathode signal, the state of the first structure 21 may be adjusted, and the light transmittance of the first structure 21 may be further adjusted.

The cathode signal wire may be electrically connected to the cathode in the light-emitting layer, and may be configured to provide an electrical signal for the cathode. The cathode signal wire may be disposed in a non-display region surrounding the display region.

The cathode signal wire may not be illustrated in FIG. 5, in practical applications, the cathode signal wire may be disposed at any location according to actual demands, which is not limited herein. In one embodiment, the cathode signal wire may be disposed in the touch-control layer 30. Alternatively, the cathode signal wire and the auxiliary electrode structure m may be made of a same material and same-layer formed. Alternatively, when the display panel includes a transistor, the cathode signal wire and a gate or a source of the transistor may be made of a same material and same-layer formed. As long as the cathode signal is capable of being inputted into the auxiliary electrode structure m through the cathode signal wire, the disposure location of the cathode signal wire may not be limited herein.

Because the touch-control layer 30 is disposed between the light adjustment layer and the base substrate 10, to enable direct contact between the first dummy touch-control structure 32 and the first structure 21, a via (k4 as illustrated in FIG. 5) may be disposed in the touch-control layer 30. Therefore, the first dummy touch-control structure 32 may apply an electrical signal to the first structure 21, to adjust the light transmittance of the first structure 21.

Accordingly, in practical applications, according to the actual demands, the auxiliary electrode structure may be disposed according to the Embodiment 1 or Embodiment 2, to meet the demands of different application scenarios and to improve the design flexibility.

In one embodiment, referring to FIG. 5, the first structure 21 may be further disposed in a region where the sub-pixels are located (the region labeled as Px in FIG. 5). The display region may include sub-pixels of multiple colors, and at least a portion of the first dummy touch-control structures may overlap with the sub-pixels in the direction perpendicular to the base substrate.

In one embodiment, the first structure corresponding to sub-pixels of a different color may be made of a different material, and the electrical signal applied to the first dummy touch-control structure corresponding to sub-pixels of a different color may be different.

In another embodiment, the first structure corresponding to sub-pixels of a different color may be made of a same material, and the electrical signal applied to the first dummy touch-control structure corresponding to sub-pixels of a different color may be the same.

To enable the first structure made of a different material to have a same light transmittance, the electrical signal applied to the first structure made of a different material may desire to be different. To enable the first structure made of a same material to have a same light transmittance, the electrical signal applied to the first structure made of a same material may be the same.

In one embodiment, for illustrative purposes, a first structure A and a first structure B respectively corresponding to sub-pixels of different colors may be made of different materials. Because when adjusting the light transmittance of the first structure made of a different material, the applied voltage is different, to enable the first structure A and the first structure B to have a same light transmittance, different voltages may desire to be applied to the first structure A and the first structure B. When the signal provided by the auxiliary electrode structure is the cathode signal, by controlling the electrical signal applied by a corresponding first dummy touch-control structure, i.e., by controlling the corresponding first dummy touch-control structures to apply different electrical signals, different voltages may be applied to the first structure A and the first structure B, thereby ensuring the first structure A and the first structure B driven under different voltages to have the same light transmittance.

Similarly, for illustrative purposes, when the first structure A and the first structure B are made of a same material, because when adjusting the light transmittance of the first structures made of a same material, the applied voltages are the same, to enable the first structure A and the first structure B to have a same light transmittance, corresponding first dummy touch-control structures may be controlled to apply a same electrical signal, to ensure the first structure A and the first structure B driven under a same voltage to have the same light transmittance.

Therefore, when the first structure corresponding to sub-pixels of a different color is made of a different material, by controlling the electrical signal applied by a corresponding first dummy touch-control structure, the first structure corresponding to sub-pixels of a different color may have a different light transmittance. Therefore, when each first structure is in the second state and in the display stage, the light filter effect may be achieved through the first structure.

In view of this, a light filter structure may not desire to be disposed in the photosensitive device region, which may simplify the structure of the display panel, reduce the production difficulty of the display panel, and reduce the production cost of the display panel.

When the first structure corresponding to sub-pixels of a different color is made of a same material, the electrical signal applied to the first structures made of the same material may be the same, such that the light transmittance of the first structure corresponding to sub-pixels of a different color may be the same. In other words, when each first structure is in the second state and in the display stage, because the light transmittance of the first structure corresponding to sub-pixels of a different color is the same, the first structure may not separately filter the light emitted by the sub-pixels of a different color.

Therefore, in one embodiment, the display panel may further include a filter structure disposed in a region where the sub-pixels are located in the photosensitive device region. The light adjustment layer may be disposed between the base substrate and the touch-control layer, and the filter structure may be disposed on a side of the touch-control layer facing away from the base substrate. In another embodiment, the light adjustment layer may be disposed on the side of the touch-control layer facing away from the base substrate, and the filter structure may be disposed on the side of the light adjustment layer facing away from the base substrate.

Figure 6:
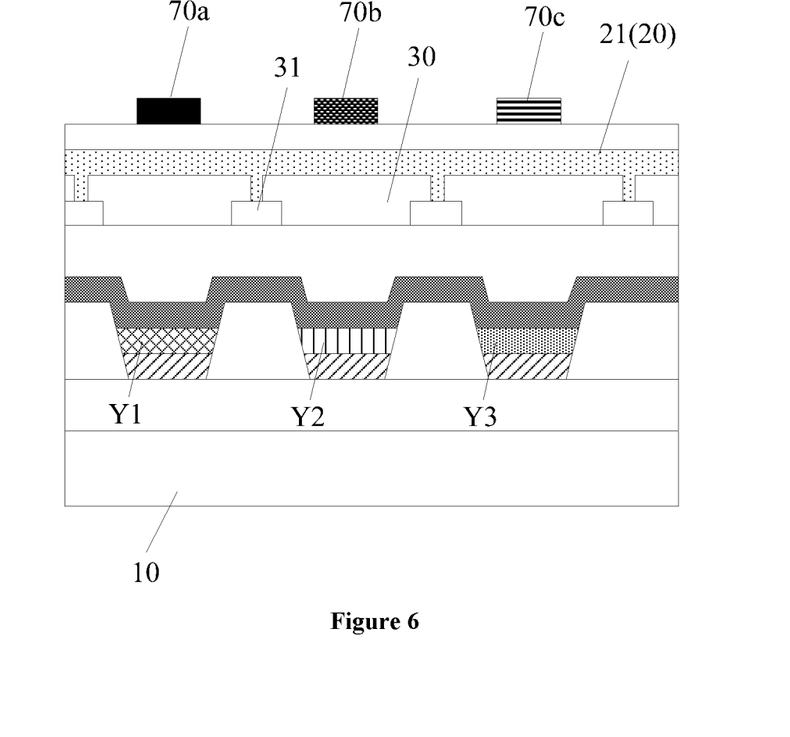
FIG. 6 illustrates a cross-sectional view of another exemplary structure of the display panel along X1-X2 direction in FIG. 1 consistent with disclosed embodiments of the present disclosure.

FIG. 6 illustrates a cross-sectional view of another exemplary structure of the display panel along X1-X2 direction in FIG. 1. In one embodiment, referring to FIG. 6, the first structure 21 may not only be disposed in the light-transmitting region T, but also be disposed in the region where the sub-pixels Px are located. The light adjustment layer 20 may be disposed on the side of the touch-control layer 30 facing away from the base substrate 10, and the filter structure (e.g., 70a, 70b, 70c) may be disposed on the side of the light adjustment layer 20 facing away from the base substrate 10.

Y1, Y2, and Y3 may represent organic light-emitting layers that are configured to emit light of different colors, respectively. In other words, the organic light-emitting layer Y1, the organic light-emitting layer Y2, and the organic light-emitting layer Y3 may correspond to organic light-emitting layers in the sub-pixels of different colors, respectively. Correspondingly, a corresponding filter structure may be disposed in a region where each of the organic light-emitting layer Y1, the organic light-emitting layer Y2, and the organic light-emitting layer Y3 is located, respectively.

In view of this, by disposing the filter structure, the light emitted by the sub-pixels of different colors may be filtered, such that the color of the light emitted by the sub-pixels of each color may be substantially accurate, and the picture presented by the display device may be substantially realistic.

In addition, because the first structure corresponding to the sub-pixels of a different color is made of a same material, the first structure may be manufactured through a single manufacturing process, which may reduce the production difficulty of the first structure, thereby reducing the production difficulty of the display panel.

In one embodiment, the first structure may be made of a material including at least one of tungsten trioxide, polythiophenes, polythiophene derivatives, viologens, tetrathiafulvalene, and metal phthalocyanine. In practical applications, the first structure may be made of any other material capable of achieving the function of the first structure, which may not be limited herein.

In one embodiment, the absolute value of the voltage difference between electrical signals applied to the first structure by the first dummy touch-control structure and the auxiliary electrode structure may be greater than or equal to 2 V, which may facilitate adjusting the state of the first structure.

In practical applications, the voltage difference between electrical signals applied to the first structure by the first dummy touch-control structure and the auxiliary electrode structure may not be limited to the above limitation, and may be set according to the actual manufacturing material of the first structure, which is not limited herein.

In one embodiment, the first structure corresponding to sub-pixels of a different color may be made of a different material, and the display region may include a plurality of pixels. The pixels may include a red sub-pixel, a blue sub-pixel, and a green sub-pixel. The manufacturing material of the first structure corresponding to sub-pixel of each color may include following.

The first structure corresponding to the sub-pixels of a red color may be made of a material including a polythiophene derivative whose side groups are methoxy and isooctyl ether. The first structure corresponding to the sub-pixels of a blue color may be made of a material including a polythiophene derivative whose side group is n-octane. The first structure corresponding to the sub-pixels of a green color may be made of a material including at least one of a thiophene monomer and a polyquinoxaline derivative. In practical applications, the first structure corresponding to sub-pixels of each color may be made of any other material capable of achieving the function of the first structure, which is not limited herein.

In one embodiment, the first structure may be further disposed in a region where the sub-pixels are located, and the display region may include sub-pixels of multiple colors. At least a portion of the first dummy touch-control structures may overlap with the sub-pixels in the direction perpendicular to the base substrate.

A plurality of first dummy touch-control structures may correspond to sub-pixels of a same color, and the electrical signal applied to at least a portion of the first dummy touch-control structures corresponding to the sub-pixels of a same color may be the same.

The touch-control layer may further include a first connection wire and a second connection wire. The first connection wire may electrically connect a plurality of first dummy touch-control structures having a same electrical signal. The first connection wire may be made of a same material as and same-layer formed with the corresponding electrically connected first dummy touch-control structures.

The second connection wire may be electrically connected to a portion of the first dummy touch-control structures of the plurality of first dummy touch-control structures having the same electrical signal. The second connection wire may be disposed in a layer different from the first dummy touch-control structure.

Figure 7:
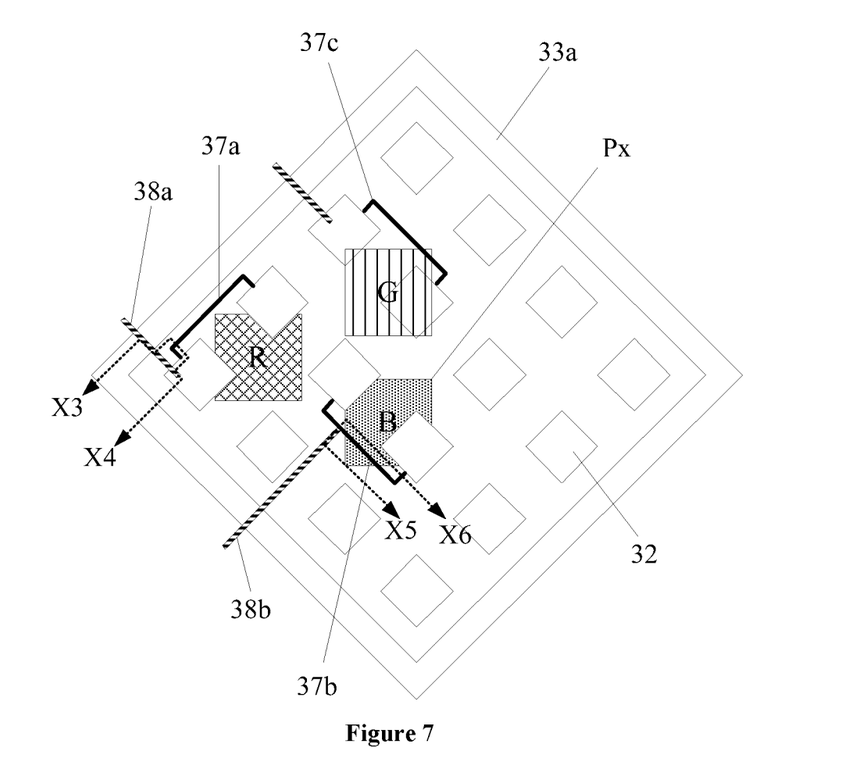
FIG. 7 illustrates a schematic diagram of an exemplary correspondence relationship between a portion of first dummy touch-control structures and sub-pixels consistent with disclosed embodiments of the present disclosure.

FIG. 7 illustrates a schematic diagram of a correspondence relationship between a portion of first dummy touch-control structures and sub-pixels. For illustrative purposes, referring to FIG. 7, the relative disposure relationship between the first dummy touch-control structures 32, the sub-pixels Px, the first connection wire and the second connection wire may be schematically illustrated, which may not indicate the corresponding quantity relationship between the first dummy touch-control structures 32 and the sub-pixels Px in practical applications.

In addition, the disposure shape of each first dummy touch-control structure and the relative disposure relationship therebetween may not be limited to those illustrated in FIG. 7, and FIG. 7 is merely illustrated as an example. In practical applications, each first dummy touch-control structure may be disposed according to actual demands, to meet the demands of different application scenarios and to improve design flexibility.

Referring to FIG. 7, the sub-pixels of three colors may include a red sub-pixel R, a green sub-pixel G, and a blue sub-pixel B. Further, referring to FIG. 7, a quantity of first dummy touch-control structures 32 corresponding to the red sub-pixel R may be two, and the two first dummy touch-control structures 32 may be electrically connected to each other through a first connection wire 37a, such that the two first dummy touch-control structures 32 may have a same electrical signal. Further, to input electrical signal into the two first dummy touch-control structures 32, a second connection wire 38a may be electrically connected to one of the two first dummy touch-control structures 32.

Similarly, a quantity of first dummy touch-control structures 32 corresponding to the blue sub-pixel B may be two, and the two first dummy touch-control structures 32 may be electrically connected to each other through a first connection wire 37b, such that the two first dummy touch-control structures 32 may have a same electrical signal. Further, to input electrical signal into the two first dummy touch-control structures 32, a second connection wire 38b may be electrically connected to the first connection wire 37b.

Similarly, a quantity of first dummy touch-control structures 32 corresponding to the green sub-pixel G may be two, and the two first dummy touch-control structures 32 may be electrically connected to each other through a first connection wire 37c, such that the two first dummy touch-control structures 32 may have a same electrical signal. Further, to input electrical signal into the two first dummy touch-control structures 32, a second connection wire 38c may be electrically connected to one of the two first dummy touch-control structures 32.

Figure 8:
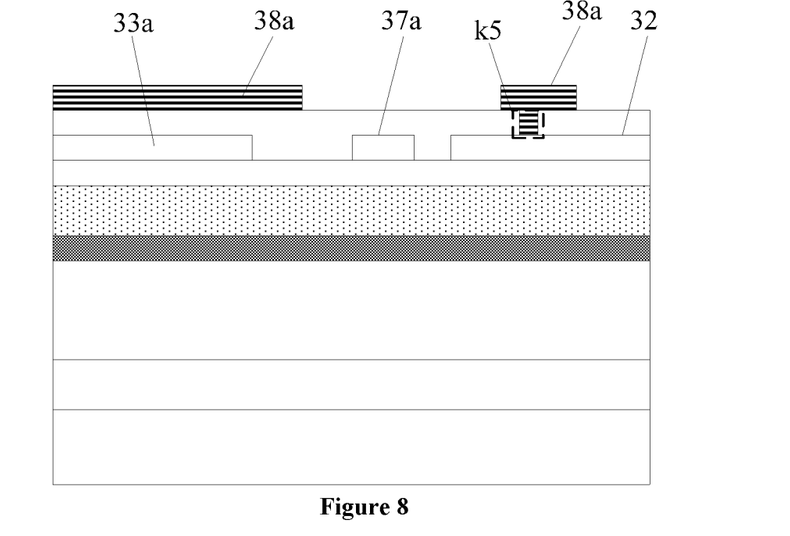
FIG. 8 illustrates a cross-sectional view of an exemplary structure of the display panel along X3-X4 direction in FIG. 7 consistent with disclosed embodiments of the present disclosure.
Figure 9:
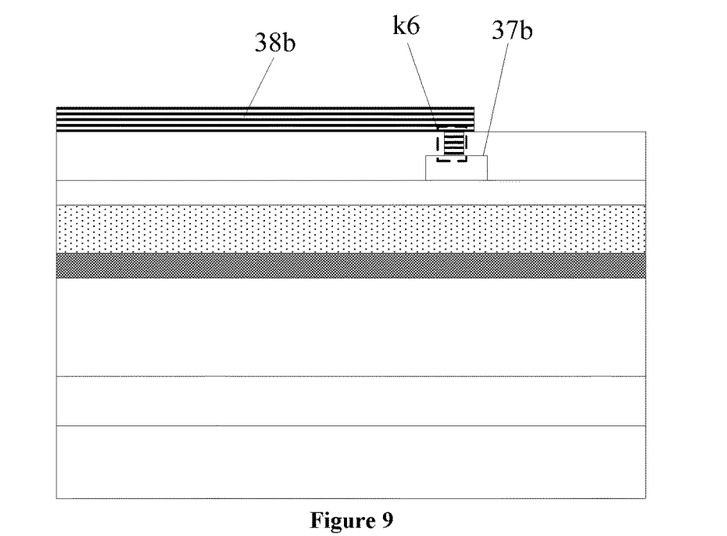
FIG. 9 illustrates a cross-sectional view of an exemplary structure of the display panel along X5-X6 direction in FIG. 7 consistent with disclosed embodiments of the present disclosure.

FIG. 8 illustrates a cross-sectional view of an exemplary structure of the display panel along X3-X4 direction in FIG. 7, and FIG. 9 illustrates a cross-sectional view of an exemplary structure of the display panel along X5-X6 direction in FIG. 7. Referring to FIG. 8, the first dummy touch-control structures 32 and the first connection wire 37a may be made of a same material and same-layer formed. The second connection wire 38a may be disposed in a layer different from the first connection wire 37a, and the second connection wire 38a may be electrically connected to the first dummy touch-control structure 32 through a via (k5 as illustrated in FIG. 8). Referring to FIG. 9, the second connection wire 38b may be disposed in a layer different from the first connection wire 37b, and the second connection wire 38b may be electrically connected to the first connection wire 37b through a via (k6 as illustrated in FIG. 9).

In view of this, on the basis of ensuring that a same electrical signal is provided to at least a portion of the first dummy touch-control structures corresponding to sub-pixels of a same color through the first connection wire and the second connection wire, the first connection wire and the second connection wire may be ensured to transmit signals normally and effectively, to avoid interfering signals on any other structure, thereby ensuring the display panel to operate normally and effectively.

In one embodiment, the touch-control layer may further include a first regular touch-control structure and a second regular touch-control structure that are made of a same material as and same-layer formed with the dummy touch-control structure.

The first regular touch-control structure may include a plurality of first sub-structures that are electrically connected to each other. The second regular touch-control structure may include a plurality of second sub-structures that are electrically connected to each other.

The touch-control layer may further include a third connection wire configured to electrically connect the first sub-structures in the first regular touch-control structure, and a fourth connection wire configured to electrically connect the second sub-structures in the second regular touch-control structure. The third connection wire and the first regular touch-control structure may be made of a same material and same-layer formed. The fourth connection wire may be disposed in a layer different from the second regular touch-control structure. The second connection wire and the fourth connection wire may be made of a same material and same-layer formed.

Figure 10:
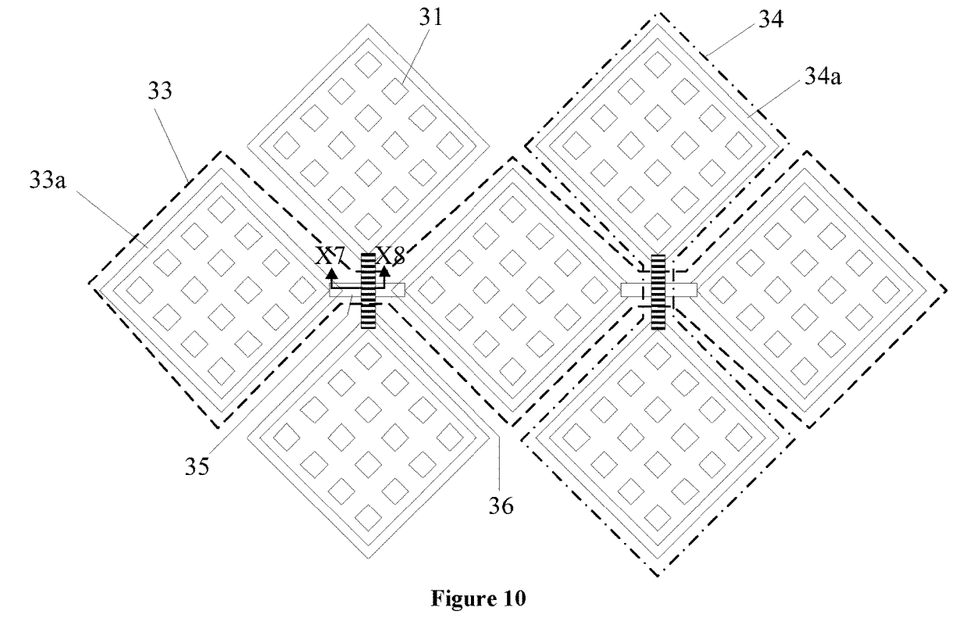
FIG. 10 illustrates a schematic diagram of each structure of an exemplary touch-control layer consistent with disclosed embodiments of the present disclosure.

FIG. 10 illustrates a schematic diagram of each structure of the touch-control structure 30. In one embodiment, referring to FIG. 10, the first regular touch-control structure 33 may include three electrically connected first sub-structures 33a, and the three first sub-structures 33a may be electrically connected through the third connection wire 35. The second regular touch-control structure 34 may include two electrically connected second sub-structures 34a, and the two second sub-structures 34a may be electrically connected through the fourth connection wire 36.

It should be noted that, in practical applications, a quantity of the first sub-structures included in the first regular touch-control structure may not be limited to three, and a quantity of the second sub-structures included in the second regular touch-control structure may not be limited to two. For illustrative purposes, FIG. 10 merely illustrates the disposure relationship between each structure, and may not indicate the actual disposure quantity.

Figure 11:
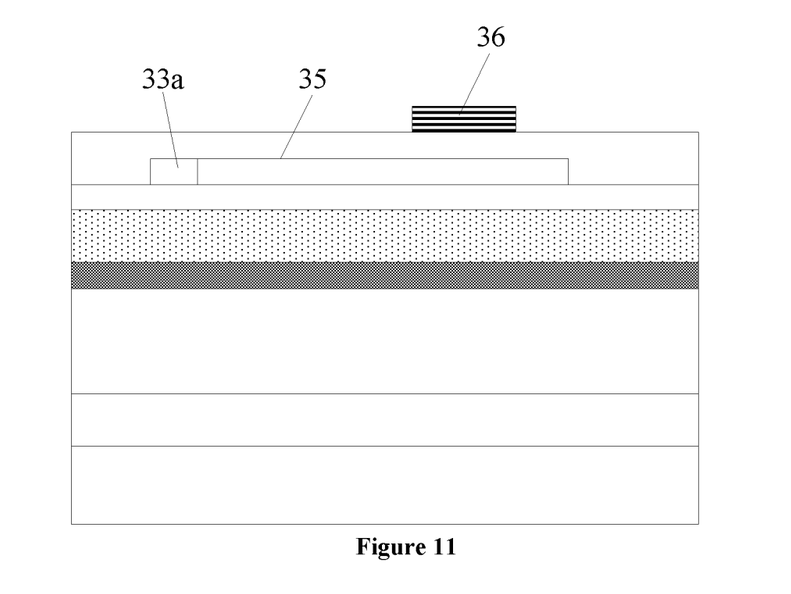
FIG. 11 illustrates a cross-sectional view of an exemplary structure of the display panel along X7-X8 direction in FIG. 10 consistent with disclosed embodiments of the present disclosure.

FIG. 11 illustrates a cross-sectional view of an exemplary structure of the display panel along X7-X8 direction in FIG. 10. Referring to FIG. 10, the fourth connection wire 36 may be disposed in a layer different from the third connection wire 35. The third connection wire 35 and the first sub-structures 33a may be made of a same material and same-layer formed, and the third connection wire 35 may be in direct contact with and electrically connected to the first sub-structure 33a. Similarly, when the first sub-structures 33a and the second sub-structures are made of a same material and same-layer formed, the fourth connection wire 36 may be electrically connected to the second sub-structures through a via (not illustrated in FIG. 11).

Therefore, based on the disposure method of the third connection wire and the fourth connection wire, the disposure method of the first connection wire and the second connection wire may include the following. The second connection wire and the fourth connection wire may be made of a same material and same-layer formed, and the first connection wire and the third connection wire may be made of a same material and same-layer formed.

In one embodiment, referring to FIG. 8, FIG. 9 and FIG. 11, the first connection wire (e.g., 37a and 37b) and the third connection wire 35 may be filled with a same pattern, which may indicate that they are same-layer formed. The second connection wire (e.g., 38a and 38b) and the fourth connection wire 36 may be filled with a same pattern, which may indicate that they are same-layer formed.

The first regular touch-control structure may be understood as a touch-control driving structure, and the second regular touch-control structure may be understood as a touch-control sensing structure. Alternatively, the first regular touch-control structure may be understood as a touch-control sensing structure, and the second regular touch-control structure may be understood as a touch-control driving structure.

In one embodiment, the touch-control detection principle may include following. Because the third connection wire overlaps with the fourth connection wire, a capacitor may be formed at the overlapped position, such that the touch-control sensing structure and the touch-control driving structure may form two electrodes of the capacitor. When a finger touches a screen of the display device, the capacitance at the touched position may be affected, and then the capacitance value at the touched position may be changed. The sensed electrical signal may be outputted through the touch-control sensing structure, thereby determining the touched position and achieving the touch-control detection function.

In view of this, through the disposure of the above-mentioned structure, while achieving the touch-control detection function, each connection wire and each touch-control structure may be prevented from interfering each other to ensure effective signal transmission, thereby ensuring normal and effective operation of the display panel.

In one embodiment, the first structure may be disposed in the regular display region, which is not illustrated in the Figures.

In view of this, the first structure may be used to reduce the reflected light of the wiring in the non-opening region in the regular display region during the display stage, thereby avoiding the influence of the reflected light on the light emitted from the opening region, and improving the display contrast and the viewing experience of the user.

In one embodiment, the dummy touch-control structure may be made of a transparent material. In view of this, the dummy touch-control structure may be prevented from blocking the light incident onto the photosensitive device region, and the light transmittance of the photosensitive device region may be improved. Therefore, the photosensitive device may receive a substantially large amount of light, thereby improving the performance of the photosensitive device and reliability of the display device.

The present disclosure also provides a method for driving the display panel in any of disclosed embodiments. The first structure in a first state may have a first light transmittance, and the first structure in a second state may have a second light transmittance. The first light transmittance may be greater than the second light transmittance.

In one embodiment, the display panel may further include an auxiliary electrode structure. The auxiliary electrode structure and the first dummy touch-control structure may be disposed on opposite sides of the first structure in a direction perpendicular to the base substrate, respectively. The auxiliary electrode structure may be in contact with the first structure. The driving method may include:

applying electrical signals to the first dummy touch-control structure and the auxiliary electrode structure to enable the first structure to be in the first state; and stopping applying an electrical signal to at least one of the first dummy touch-control structure and the auxiliary electrode structure to enable the first structure to be in the second state.

Figure 12:
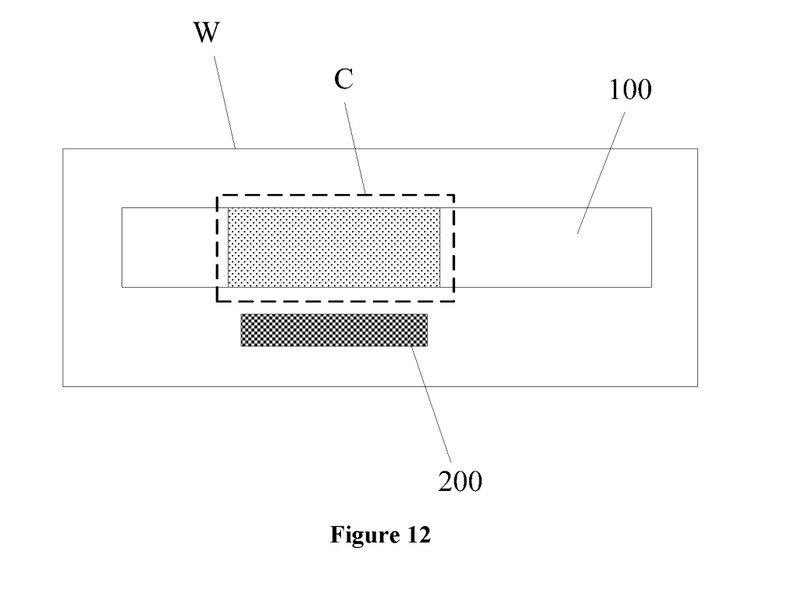
FIG. 12 illustrates a schematic diagram of an exemplary display device consistent with disclosed embodiments of the present disclosure.

The present disclosure further provides a display device. FIG. 12 illustrates a schematic diagram of a display device. Referring to FIG. 12, the display device W may include the above-mentioned display panel 100 in any of disclosed embodiments. A photosensitive device 200 may be correspondingly disposed in the photosensitive device region C of the display panel 100.

In one embodiment, the display panel may be an electroluminescent display panel. The display panel may include an array-substrate and a counter-substrate that are oppositely disposed. Sub-pixels may be disposed on the array-substrate, and the sub-pixel may include a pixel circuit and a light-emitting layer that are electrically connected to each other, which are not illustrated. The light-emitting layer may emit light under the driving of the pixel circuit, thereby achieving the display function.

In one embodiment, the photosensitive device may be a device that uses the received light to operate, e.g., a camera, or a fingerprint recognition structure, etc., which is not limited herein.

Figure 13:
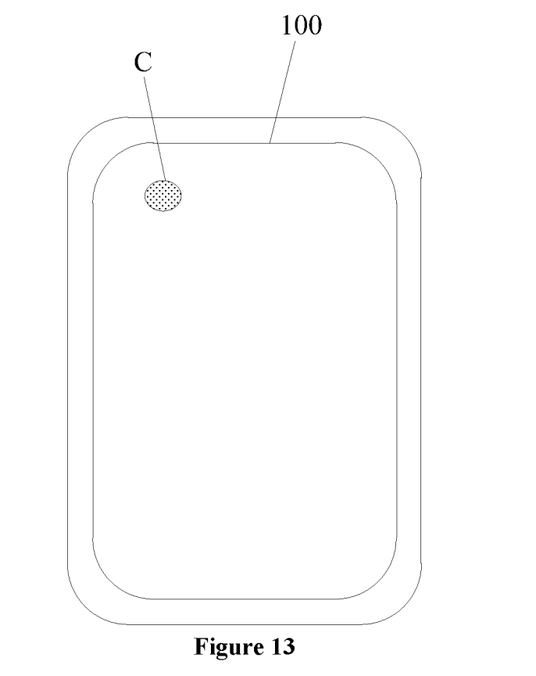
FIG. 13 illustrates a schematic diagram of another exemplary display device consistent with disclosed embodiments of the present disclosure.

In one embodiment, the display device may be any product or component having a display function, e.g., a mobile phone (as illustrated in FIG. 13), a tablet computer, a television, a display, a notebook computer, a digital photo frame, a navigator, etc. The implementation of the display device may refer to the embodiments of the display panel described above, and is not repeated herein.

In the disclosed display panel and driving method, and the display device, the display region may include the photosensitive device region. When a photosensitive device is disposed in the photosensitive device region, the issue that the photosensitive device occupies a large area when being disposed in the border may be prevented, such that the border may be set substantially narrow to increase the screen ratio and achieve the narrow-border design.

The first structure may be disposed in the corresponding light-transmitting region in the photosensitive device region. The first structure in the first state may have the first light transmittance, and the first structure in the second state may have the second light transmittance. The first light transmittance may be greater than the second light transmittance. Therefore, when the photosensitive device is in the operating state, the first structure may have the first light transmittance, such that a substantially large amount of light may be incident into the photosensitive device through the first structure, thereby improving the performance of the photosensitive device and the reliability of the display device.

In addition, when the photosensitive device is in a non-operating state and the display panel is in a display state, if the first structure has the second light transmittance, the amount of light transmitted through the light-transmitting region may be reduced by the first structure, thereby reducing the amount of light reflected by the wiring disposed in the light-transmitting region, and improving display contrast and display effect.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
   a display region, including a photosensitive device region and a regular display region, wherein the regular display region at least partially surrounds the photosensitive device region, the display region includes a plurality of sub-pixels, and the photosensitive device region includes a plurality of light-transmitting regions;
   a base substrate;
   an auxiliary electrode structure; and
   a light adjustment layer and a touch-control layer disposed over the base substrate, wherein:
      the touch-control layer includes a dummy touch-control structure, and the light adjustment layer includes a first structure disposed at least in a light-transmitting region of the plurality of light-transmitting regions,
      at least a portion of the dummy touch-control structure and the first structure have an overlapped region in a direction perpendicular to the base substrate,
      the dummy touch-control structure includes a first dummy touch-control structure in the overlapped region, and the first dummy touch-control structure is in contact with the first structure,
      the first structure in a first state has a first light transmittance, the first structure in a second state has a second light transmittance, and the first light transmittance is greater than the second light transmittance,
      the auxiliary electrode structure and the first dummy touch-control structure are disposed on opposite sides of the first structure in the direction perpendicular to the base substrate, respectively,
      the auxiliary electrode structure is in contact with the first structure,
      the first structure is in the first state, after the first dummy touch-control structure and the auxiliary electrode structure receive electrical signals, and
      the first structure is in the second state, when at least one of the first dummy touch-control structure and the auxiliary electrode structure does not receive an electrical signal.

2. The display panel according to claim 1, wherein:
   the light adjustment layer is disposed between the base substrate and the touch-control layer, wherein:
   the display panel further includes a light-emitting layer disposed between the base substrate and the light adjustment layer, wherein:
      the light-emitting layer includes a first electrode, a second electrode, and an organic light-emitting layer disposed between the first electrode and the second electrode,
      the second electrode is disposed over a side of the first electrode facing away from the base substrate, and
      the second electrode is multiplexed as the auxiliary electrode structure.

3. The display panel according to claim 2, wherein:
   the second electrode is disposed fully covering the photosensitive device region.

4. The display panel according to claim 2, wherein:
   the light adjustment layer is in surface contact with the auxiliary electrode structure.

5. The display panel according to claim 1, wherein:
   the light adjustment layer is disposed between the base substrate and the touch-control layer, wherein:
   the display panel further includes a light-emitting layer, a first inorganic layer, and a second inorganic layer, wherein:
      the light-emitting layer is disposed between the base substrate and the light adjustment layer,
      the first inorganic layer is disposed between the light-emitting layer and the light adjustment layer,
      the second inorganic layer is disposed between the light adjustment layer and the touch-control layer, and
      the first inorganic layer covers the light-emitting layer.

6. The display panel according to claim 5, wherein:
   the light adjustment layer is an organic layer, and
   the light adjustment layer is in direct contact with the first inorganic layer and the second inorganic layer, respectively.

7. The display panel according to claim 5, wherein:
   the auxiliary electrode structure is disposed over a side of the first inorganic layer facing away from the light adjustment layer,
   the first inorganic layer includes a plurality of first openings, and the auxiliary electrode structure is in contact with the first structure at the plurality of first openings, and
   the second inorganic layer includes a plurality of second openings, and the first dummy touch-control structure is in contact with the first structure at the plurality of second openings.

8. The display panel according to claim 1, wherein:
   the light adjustment layer is disposed over a side of the touch-control layer facing away from the base substrate, and the auxiliary electrode structure is disposed over a side of the light adjustment layer facing away from the base substrate, wherein:
   the display panel further includes a light-emitting layer and a cathode signal wire disposed between the base substrate and the touch-control layer, wherein:
   the light-emitting layer includes a cathode, and
   the auxiliary electrode structure and the cathode are electrically connected to the cathode signal wire.

9. The display panel according to claim 1, wherein:
   the first structure is further disposed in a region where the plurality of sub-pixels are located,
   the display region includes sub-pixels of multiple colors, and at least a portion of the first dummy touch-control structure overlaps with a sub-pixel of the sub-pixels of multiple colors in the direction perpendicular to the base substrate, a plurality of first dummy touch-control structures correspond to sub-pixels of a same color, and an electrical signal applied to at least a portion of the plurality of first dummy touch-control structures corresponding to the sub-pixels of the same color is the same, the touch-control layer further includes a first connection wire and a second connection wire, the first connection wire electrically connects the plurality of first dummy touch-control structures having a same electrical signal, and the first connection wire is made of a same material as and same-layer formed with the corresponding electrically connected plurality of first dummy touch-control structures, and the second connection wire is electrically connected to a portion of the plurality of first dummy touch-control structures having the same electrical signal, and the second connection wire is disposed in a layer different from the plurality of first dummy touch-control structures.

10. The display panel according to claim 9, wherein:

the touch-control layer further includes a first regular touch-control structure and a second regular touch-control structure that are made of a same material as and same-layer formed with the dummy touch-control structure, the first regular touch-control structure includes a plurality of electrically connected first sub-structures, and the second regular touch-control structure includes a plurality of electrically connected second sub-structures, the touch-control layer further includes a third connection wire configured to electrically connect the plurality of first sub-structures of the first regular touch-control structure, and a fourth connection wire configured to electrically connect the plurality of second sub-structures of the second regular touch-control structure, and the third connection wire is made of a same material as and same-layer formed with the first regular touch-control structure, the fourth connection wire is disposed in a layer different from the second regular touch-control structure, and the second connection wire is made of a same material as and same-layer formed with the fourth connection wire.

11. The display panel according to claim 1, wherein:
the first structure is further disposed in the regular display region.

12. The display panel according to claim 1, wherein:
the dummy touch-control structure is made of a transparent material.

13. A display panel, comprising:

a display region, including a photosensitive device region and a regular display region, wherein the regular display region at least partially surrounds the photosensitive device region, the display region includes a plurality of sub-pixels, and the photosensitive device region includes a plurality of light-transmitting regions;

a base substrate; and a light adjustment layer and a touch-control layer disposed over the base substrate, wherein:

the touch-control layer includes a dummy touch-control structure, and the light adjustment layer includes a first structure disposed at least in a light-transmitting region of the plurality of light-transmitting regions, at least a portion of the dummy touch-control structure and the first structure have an overlapped region in a direction perpendicular to the base substrate, the dummy touch-control structure includes a first dummy touch-control structure in the overlapped region, and the first dummy touch-control structure is in contact with the first structure, the first structure in a first state has a first light transmittance, the first structure in a second state has a second light transmittance, and the first light transmittance is greater than the second light transmittance, wherein:

the first structure is further disposed in a region where the plurality of sub-pixels are located, the display region includes sub-pixels of multiple colors, and at least a portion of the first dummy touch-control structure overlaps with a sub-pixel of the sub-pixels of multiple colors in the direction perpendicular to the base substrate, and the first structure corresponding to sub-pixels of a different color is made of a different material, and an electrical signal applied to the first dummy touch-control structure corresponding to the sub-pixels of the different color is different, or:

the first structure is further disposed in a region where the plurality of sub-pixels are located, the display region includes sub-pixels of multiple colors, and at least a portion of the first dummy touch-control structure overlaps with a sub-pixel of the sub-pixels of multiple colors in the direction perpendicular to the base substrate, and the first structure corresponding to sub-pixels of a different color is made of a same material, and an electrical signal applied to the first dummy touch-control structure corresponding to the sub-pixels of the different color is the same.

14. The display panel according to claim 13, wherein:
the display panel further includes a filter structure disposed in the region where the plurality of sub-pixels are located in the photosensitive device region, and the light adjustment layer is disposed between the base substrate and the touch-control layer, and the filter structure is disposed over a side of the touch-control layer facing away from the base substrate, or the light adjustment layer is disposed over the side of the touch-control layer facing away from the base substrate, and the filter structure is disposed over a side of the light adjustment layer facing away from the base substrate.

15. The display panel according to claim 13, wherein:
the first structure is made of a material including at least one of tungsten trioxide, polythiophenes, polythiophene derivatives, viologens, tetrathiafulvalene, and metal phthalocyanine.

16. A display device, comprising:
a display panel, wherein the display panel includes:
a display region, including a photosensitive device region and a regular display region, wherein the regular display region at least partially surrounds the photosensitive device region, the display region includes a plurality of sub-pixels, and the photosensitive device region includes a plurality of light-transmitting regions;
a base substrate;
an auxiliary electrode structure; and
a light adjustment layer and a touch-control layer disposed over the base substrate, wherein:
the touch-control layer includes a dummy touch-control structure, and the light adjustment layer includes a first structure disposed at least in a light-transmitting region of the plurality of light-transmitting regions,
at least a portion of the dummy touch-control structure and the first structure have an overlapped region in a direction perpendicular to the base substrate,
the dummy touch-control structure includes a first dummy touch-control structure in the overlapped region, and the first dummy touch-control structure is in contact with the first structure,
the first structure in a first state has a first light transmittance, the first structure in a second state has a second light transmittance, and the first light transmittance is greater than the second light transmittance,
the auxiliary electrode structure and the first dummy touch-control structure are disposed on opposite sides of the first structure in the direction perpendicular to the base substrate, respectively,
the auxiliary electrode structure is in contact with the first structure,
the first structure is in the first state, after the first dummy touch-control structure and the auxiliary electrode structure receive electrical signals, and
the first structure is in the second state, when at least one of the first dummy touch-control structure and the auxiliary electrode structure does not receive an electrical signal,
wherein a photosensitive device is correspondingly disposed in the photosensitive device region of the display panel.

17. A driving method of a display panel, wherein:
the display panel includes:
a base substrate,
a light adjustment layer including a first structure,
a touch-control layer including a dummy touch-control structure, wherein the dummy touch-control structure includes a first dummy touch-control structure in an overlapped region between the dummy touch-control structure and the first structure in a direction perpendicular to the base substrate, and
an auxiliary electrode structure, wherein the auxiliary electrode structure and the first dummy touch-control structure are disposed on opposite sides of the first structure in the direction perpendicular to the base substrate, respectively, and the auxiliary electrode structure and the first dummy touch-control structure are in contact with the first structure, respectively; and
the driving method includes:
applying electrical signals to the first dummy touch-control structure and the auxiliary electrode structure to enable the first structure to be in a first state, and
stopping applying an electrical signal to at least one of the first dummy touch-control structure and the auxiliary electrode structure to enable the first structure to be in a second state, wherein:
the first structure in the first state has a first light transmittance, the first structure in the second state has a second light transmittance, and the first light transmittance is greater than the second light transmittance.

18. The method according to claim 17, wherein:
the dummy touch-control structure is made of a transparent material.

\* \* \* \* \*